United States Patent
Freund et al.

(10) Patent No.: US 6,204,092 B1
(45) Date of Patent: Mar. 20, 2001

(54) APPARATUS AND METHOD FOR TRANSFERRING SEMICONDUCTOR DIE TO A CARRIER

(75) Inventors: Joseph M. Freund, Fogelsville; George J. Przybylek, Douglasville; Dennis M. Romero, Allentown, all of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/290,421

(22) Filed: Apr. 13, 1999

(51) Int. Cl.[7] .......................... H01L 21/44; H01L 21/48; H01L 21/50
(52) U.S. Cl. .................... 438/113; 438/118; 438/460; 438/464; 438/976
(58) Field of Search ..................... 438/113, 118, 438/460, 464, 976

(56) References Cited

U.S. PATENT DOCUMENTS 3,887,996 * 6/1975 Hartleroad et al. ............. 29/583
4,667,402 * 5/1987 Wilde ............................. 29/840
4,859,269 * 8/1989 Nishiguchi ...................... 156/361
5,105,255 * 4/1992 Shannon et al. ................ 357/68
5,415,331   5/1995 Lin ................................. 228/213

* cited by examiner

Primary Examiner—John F. Niebling
Assistant Examiner—David A. Zarneke
(74) Attorney, Agent, or Firm—Dickstein Shapiro Morin & Oshinsky, LLP

(57) ABSTRACT

An apparatus and method for transferring a semiconductor die from an adhesive film to an output carrier is disclosed. The adhesive film and associated hoop assembly on which the die are secured are inverted so that die face downward, p-side down, from the film. And an output pack is positioned beneath the die. An ejector pin exerts a force on a side of the adhesive film opposite the side on which the semiconductor die is secured to release the die. A vacuum is provided through a port in the output pack, pulling the released die into the output pack. The transfer occurs in a single step and orients the die p-side down in the output pack, thus eliminating the control arm/vacuum collet assembly and associated handling steps of conventional transfer mechanisms.

10 Claims, 3 Drawing Sheets

APPARATUS AND METHOD FOR TRANSFERRING SEMICONDUCTOR DIE TO A CARRIER

BACKGROUND OF THE INVENTION

1. Field of the Invention

The present invention relates generally to semiconductor processing, and more particularly to a method and apparatus for transferring a semiconductor die from an adhesive film hoop assembly to an output carrier pack.

2. Description of the Related Art

Semiconductor dies are typically manufactured by depositing on a wafer of material, such as silicon dioxide or gallium arsenide, a plurality of different layers of conductive, semiconductive and dielectric materials in precisely defined configurations. When the wafers are completed they are diced into individual dies, which are often very delicate. The individual semiconductor dies are difficult to handle during assembly of electronic apparatus because of their relatively small size and because certain types of semiconductor dies, such as laser diodes, are extremely fragile and thus easily damaged. A laser bar, also referred to as a bar of diodes, is formed by cleaving a section from a larger wafer on an adhesive film stretched over a hoop assembly. The wafer has a number of contiguous diodes, called the active strip, in a common substrate. The surface of the substrate in which the active strip is located is typically referred to as the p-side of the substrate. Typically, bonding pads, formed from a material such as gold, are formed on a surface of the semiconductor die to allow for connection of the semiconductor die to additional circuitry.

After the dies have been separated, they are placed on a die attach pad for bonding in an integrated circuit (IC) package or placed in a carrier for further packaging. This process is typically performed by a device known as a pick and place device. Each die is lifted by a collet and placed on a die attach pad or in a carrier. Die collets for placement of semiconductor dies are well known in the art.

FIG. 1 illustrates a typical commercially available pick and place device 10. Device 10 may include a microscope 12, an adjustable work platform 14, and a control arm 16. A collet 20 is secured at the end of the control arm which is designed to hold a semiconductor die (not shown) in position for die bonding or placement in a carrier or mounting member 18 positioned on the adjustable work platform 14.

FIG. 2 illustrates a conventional technique for transferring a semiconductor die from an adhesive film to a carrier which may be used by pick and place device 10 of FIG. 1.

A plurality of dies 40, usually rectangular in shape, are processed on a layer of adhesive film 32 by any technique as is known in the art. Adhesive film 32 is typically secured at its edges by clamps 34 as illustrated in FIG. 2. Disposed beneath adhesive film 32 is an expansion frame, such as for example a hoop frame 36, movable in the direction of arrow 38 such that expansion frame 36 pushes upward on film 32 distending it vertically and stretching it horizontally, providing a tense, flat surface on which the semiconductor dies 40 reside.

For placement of each die 40 on a die attach pad of an integrated circuit (IC) or in a carrier for further packaging, each die 40 is lifted from film 32 by collet 20 of pick and place device 10. Collet 20 has an aperture 46 at its distal end and a vacuum hole 48 extending through the length of collet 20 through which a vacuum pressure is exerted for lifting die 40. A die 40 is lifted by collet 20 by positioning aperture 46 over a die 20, exerting a vacuum pressure in the direction of arrow 52 and simultaneously moving an ejector pin 54 upwardly against the lower surface of film 32. Ejector pin 54 assists collet 20 in removing die 40 from adhesive film 32. Collet 20 is then moved upwardly away from film 32 by control arm 16 and positioned in another location for depositing the die 40 into another carrier (not shown), typically a pocket within a flat pack IC package.

There are problems, however, with the conventional pick and place operation as described with respect to FIG. 2. For example, the removal of die 40 from film 32 by collet 20 and placement into a carrier requires that the control arm 16 move very precisely and at high speeds to ensure that the die 40 are not damaged and the throughput maintained. Additionally, the manufacturing process of die 40 allows only for the p-side to be up, i.e., the p-side can only be formed on the surface 41 of die 40 facing toward the collet 20. It is preferable, for alignment purposes of the laser with external optics and also for thermal dissipation of the die 40, to mount the die 40 p-side down in the end circuit. Thus, the die 40, which is placed in an output carrier p-side up after being removed from film 32, must be re-oriented p-side down in another carrier before bonding in the end circuit. Currently this process is done using a mechanical flipping operation that is cumbersome and operator intensive, resulting in further risk of damaging the die 40 and increased production costs.

Thus, there exists a need for an apparatus and method for transferring a semiconductor die from an adhesive film to an output carrier that eliminates the control arm/vacuum collet assembly and associated handling steps and orients the die p-side down into the output carrier.

SUMMARY OF THE INVENTION

The present invention overcomes the problems associated with the prior art and provides an apparatus and method for transferring a semiconductor die from an adhesive to an output carrier that eliminates the control arm/vacuum collet assembly and associated handling steps, while orienting the die p-side down into the output carrier.

In accordance with a preferred embodiment of the present invention, the adhesive film on which the die are secured is inverted so that the die face downward, p-side down, from the film. An output pack pocket is positioned beneath the die, and an ejector pin is pushed down from the top of the film to release the die. A vacuum is provided through a port in the pocket, pulling the released die into the port. Thus, the transfer occurs in a single step and orients the die p-side down in the output pack, eliminating the control arm/ vacuum collet assembly and associated handling steps of conventional transfer mechanisms.

These and other advantages and features of the invention will become apparent from the following detailed description of the invention which is provided in connection with the accompanying drawings, in which like items are referred to by like numerals.

DETAILED DESCRIPTION OF THE PREFERRED EMBODIMENTS

The present invention will be described as set forth in the preferred embodiments illustrated in FIGS. 3–4. Other embodiments may be utilized and structural or logical changes may be made without departing from the spirit or scope of the present invention.

Figure 3A:
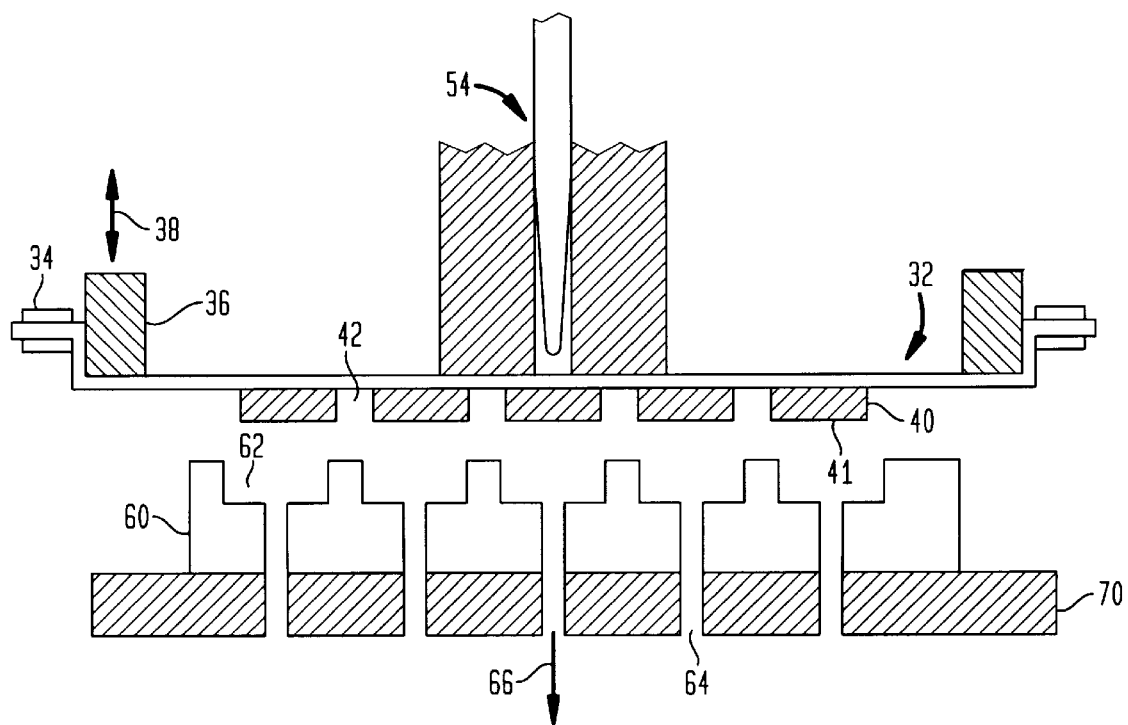
FIGS. 3A and 3B illustrate a technique for depositing a semiconductor die into a carrier in accordance with a first embodiment of the present invention.
Figure 3B:
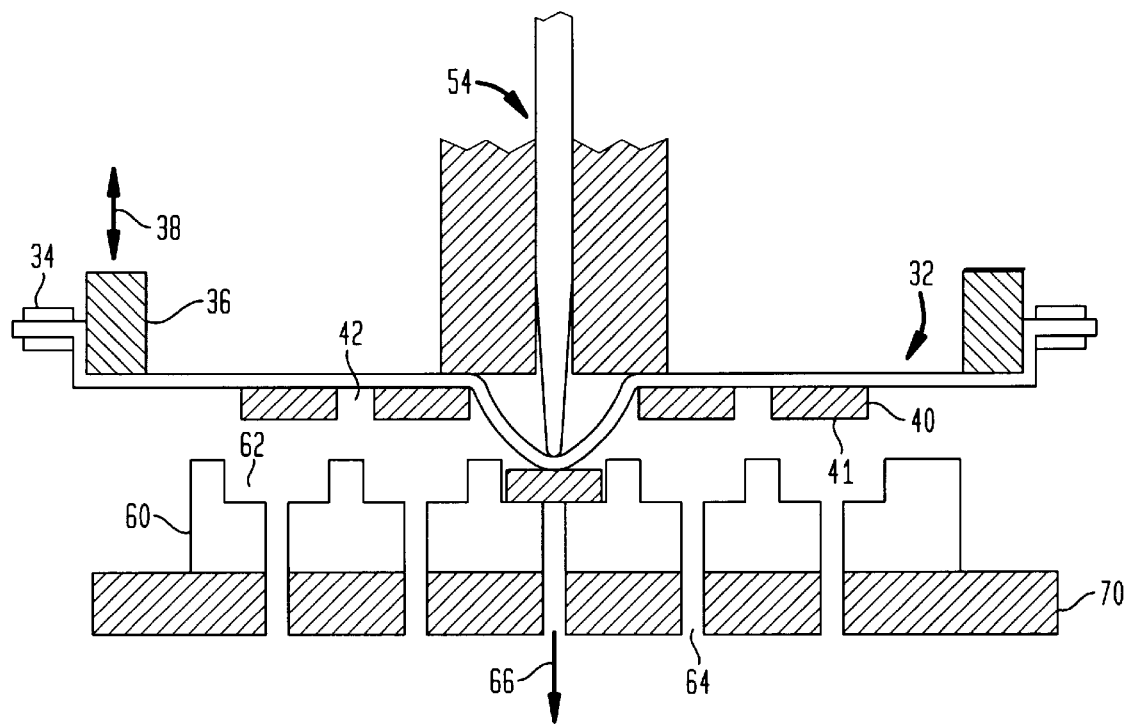

In accordance with the present invention, a semiconductor die can be transferred from an adhesive film to an output carrier, oriented p-side down, without requiring a control arm/vacuum collet assembly and associated handling steps of conventional techniques. FIGS. 3A and 3B illustrate a preferred technique for depositing a semiconductor die 40 into a carrier 60 in accordance with a first embodiment of the present invention.

Figure 1:
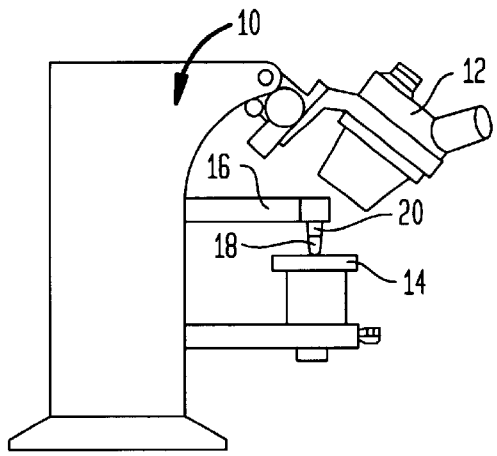
FIG. 1 illustrates a typical commercially available pick and place device.
Figure 2:
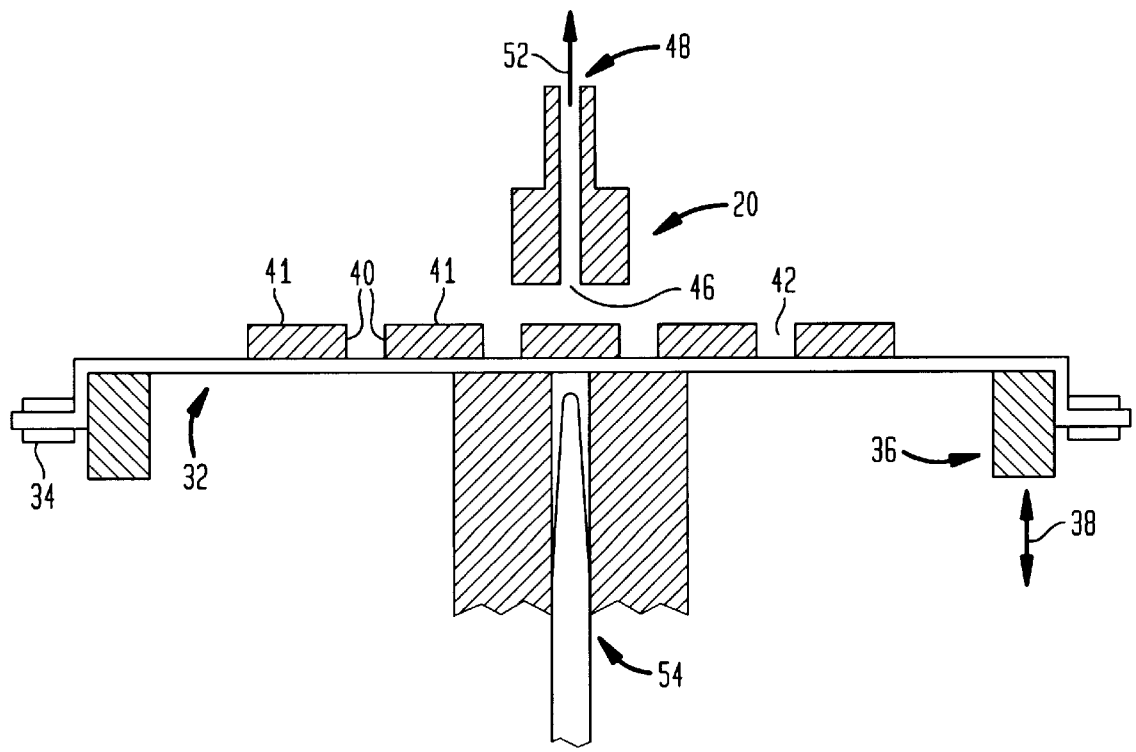
FIG. 2 illustrates a conventional technique for depositing a semiconductor die into a carrier which may be used by pick and place device of FIG. 1.

A plurality of semiconductor dies 40 are mounted on an adhesive film 32 as described with respect to FIG. 2. In accordance with the present invention, hoop assembly 36 and adhesive film 32 are inverted so that the die 40 are faced downward away from the film as illustrated in FIG. 3A. The adhesive of adhesive film 32 is strong enough to prevent the die 40 from separating from film 32 and falling. The p-side of die 40, formed on surface 41 of die 40, faces downward away from adhesive film 32. An output carrier or pack, such as a flat pack 60, having a plurality of pockets 62 into which die 40 are to be inserted, is positioned below the adhesive film 32 on support 70. Each pocket 62 is provided with a vacuum hole 64 extending through the carrier 60 and support 70 through which a vacuum pressure can be exerted.

For placement of the die 40 into pocket 62 of carrier 60, a vacuum pressure in the direction of arrow 66 is exerted while ejector pin 54 moves downwardly against the upper surface (originally the lower surface before inversion) of film 32 as shown in FIG. 3B. Ejector pin 54 assists in separating die 40 from adhesive film 32, while the vacuum pressure pulls the die 40 into the pocket 60. When ejector pin 54 is retracted, adhesive film 32 separates from die 40, leaving die 40 in pocket 62 of carrier 60. Since the p-side of die 40 was on surface 41 facing toward carrier 60, die 40 is oriented p-side down in carrier 60.

Figure 4A:
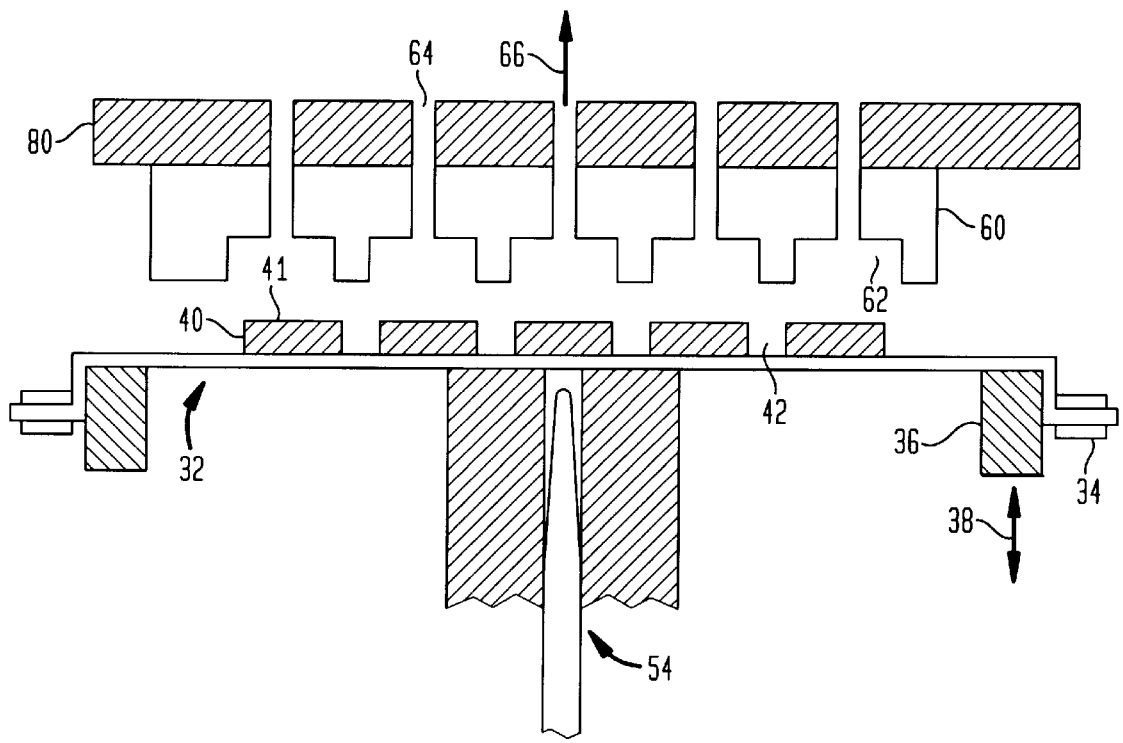
FIGS. 4A and 4B illustrate a technique for depositing a semiconductor die into a carrier in accordance with a second embodiment of the present invention.
Figure 4B:
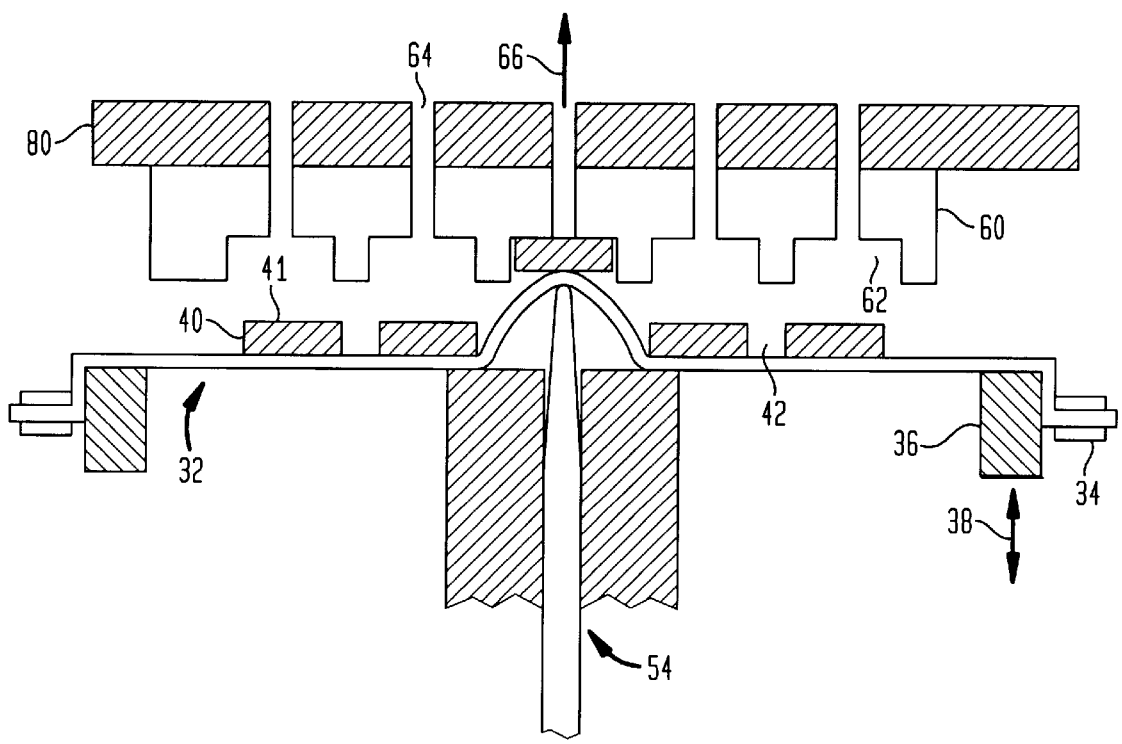

FIGS. 4A and 4B illustrate a preferred technique for depositing a semiconductor die 40 into a carrier 60 in accordance with a second embodiment of the present invention. In accordance with the present invention, an output carrier or pack 60, having a plurality of pockets 62 into which die 40 are to be inserted, is positioned upside down above the adhesive film 32, secured by support 80. Each pocket 62 is provided with a vacuum hole 64 extending through the carrier 60 and support 80 through which a vacuum pressure can be exerted.

For placement of the die 40 into pocket 62 of carrier 60, a vacuum pressure in the direction of arrow 66 is exerted while ejector pin 54 moves upwardly against the lower surface of film 32 as shown in FIG. 4B. Ejector pin 54 assists in separating die 40 from adhesive film 32, while the vacuum pressure pulls the die 40 into the pocket 60. When ejector pin 54 is retracted, adhesive film 32 separates from die 40, leaving die 40 in pocket 62 of carrier 60. Since the p-side of die 40 was on surface 41 facing toward carrier 60, die 40 is oriented p-side down in carrier 60.

Thus, in accordance with the present invention, a die 40 is separated from a adhesive film 32 and deposited into a carrier 60 p-side down in a single step without using a control arm/vacuum collet assembly and associated handling steps, thus significantly reducing the risk of damaging die 40 during the transfer process and reducing the amount of labor required.

Reference has been made to preferred embodiments in describing the invention. However, additions, deletions, substitutions, or other modifications which would fall within the scope of the invention defined in the claims may be implemented by those skilled in the art and familiar with the disclosure of the invention without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method for transferring at least one semiconductor die secured to a first surface of an adhesive film directly to an output carrier, said method comprising the steps of:

aligning said output carrier with said at least one semiconductor die;

moving an ejector pin against a surface of said adhesive film opposite said first surface on which said at least one semiconductor die is secured;

exerting a vacuum pressure through a port in said output carrier;

separating said semiconductor die from said adhesive film; and depositing said semiconductor die from said adhesive film directly into said output carrier.

2. The method according to claim 1, wherein said aligning step further comprises:

positioning said output carrier upside down above said first surface of said adhesive tape on which said at least one semiconductor die is secured.

3. The method according to claim 2, wherein said moving step further comprises:

moving an ejector pin upwardly against a surface of said adhesive film opposite said first surface on which said at least one semiconductor die is secured.

4. The method according to claim 1, wherein said aligning step further comprises:

inverting said adhesive film, said inversion resulting in said first surface of said adhesive film on which said at least one semiconductor die is secured facing downward.

5. The method according to claim 4, wherein said aligning step further comprises:

positioning said output carrier beneath said first surface of said adhesive tape on which said at least one semiconductor die is secured.

6. The method according to claim 5, wherein said moving step further comprises:

moving an ejector pin downwardly against a surface of said adhesive film opposite said first surface on which said at least one semiconductor die is secured.

7. The method according to claim 1, wherein said at least one semiconductor die is transferred to a pocket in said output carrier.

8. The method according to claim 1, wherein said at least one semiconductor die is a laser bar.

9. The method according to claim 8, further comprising:

depositing said laser bar p-side down in said output carrier.

10. The method according to claim 1, wherein said output carrier is a flat pack.

* * * * *